US012439617B2

United States Patent
Fukasawa et al.

(10) Patent No.: US 12,439,617 B2
(45) Date of Patent: Oct. 7, 2025

(54) POWER SEMICONDUCTOR DEVICE INCLUDING A SUBSTRATE AND AN ELECTRODE HAVING MULTIPLE LAYERS WITH ONE OF THE UPPER LAYERS BEING IN DIRECT CONTACT WITH A PORTION OF THE SURFACE OF THE SUBSTRATE

(71) Applicant: Mitsubishi Electric Corporation, Tokyo (JP)

(72) Inventors: Toshiki Fukasawa, Tokyo (JP); Tomohito Kudo, Tokyo (JP); Hideki Haruguchi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 405 days.

(21) Appl. No.: 17/999,359

(22) PCT Filed: Jul. 16, 2020

(86) PCT No.: PCT/JP2020/027586
§ 371 (c)(1),
(2) Date: Nov. 18, 2022

(87) PCT Pub. No.: WO2022/013991
PCT Pub. Date: Jan. 20, 2022

(65) Prior Publication Data
US 2023/0207707 A1     Jun. 29, 2023

(51) Int. Cl.
*H10D 8/60*     (2025.01)
*H10D 8/01*     (2025.01)
(Continued)

(52) U.S. Cl.
CPC ............ *H10D 8/605* (2025.01); *H10D 8/051* (2025.01); *H10D 30/668* (2025.01); *H10D 62/106* (2025.01)

(58) Field of Classification Search
None
See application file for complete search history.

(56) References Cited

U.S. PATENT DOCUMENTS

2012/0104612 A1*   5/2012   Kimura ................. H10D 62/83
                                                                                        438/653
2014/0048847 A1     2/2014   Yamashita et al.
(Continued)

FOREIGN PATENT DOCUMENTS

CN        108695317 A     10/2018
CN        110085671 A     8/2019
(Continued)

OTHER PUBLICATIONS

An Office Action; "Notice of Reasons for Refusal," mailed by the Japanese Patent Office on Mar. 28, 2023, which corresponds to Japanese Patent Application No. 2022-536055 and is related to U.S. Appl. No. 17/999,359; with English language translation.
(Continued)

*Primary Examiner* — Davienne N Monbleau
*Assistant Examiner* — Dmitri Mihaliov
(74) *Attorney, Agent, or Firm* — Studebaker Brackett PLLC

(57) ABSTRACT

A silicon substrate has first to fourth semiconductor regions. The third semiconductor region is separated from the first semiconductor region of a first conductivity type by the second semiconductor region of a second conductivity type. The fourth semiconductor region of the second conductivity type is separated from the second semiconductor region by the third semiconductor region. A first electrode is provided on a first surface. A barrier metal layer is provided on a first portion of a second surface. A second electrode is provided on the second surface, and is separated from the first portion of the second surface by the barrier metal layer. The second electrode includes an aluminum-silicon (Al—Si) layer in
(Continued)

contact with a second portion of the second surface, and an Al layer separated from the second portion of the second surface by the Al—Si layer.

9 Claims, 9 Drawing Sheets

(51) Int. Cl.
    *H10D 30/66*     (2025.01)
    *H10D 62/10*     (2025.01)

(56) References Cited

U.S. PATENT DOCUMENTS

| | | | |
|---|---|---|---|
| 2016/0380068 A1* | 12/2016 | Nobukuni | H10D 30/668 257/652 |
| 2018/0294258 A1 | 10/2018 | Kamibaba et al. | |
| 2019/0228973 A1 | 7/2019 | Kimura | |

FOREIGN PATENT DOCUMENTS

| | | |
|---|---|---|
| JP | H01-238013 A | 9/1989 |
| JP | 2010-278164 A | 12/2010 |
| JP | 2013-048230 A | 3/2013 |
| JP | 2017-011129 A | 1/2017 |
| JP | 2018-181949 A | 11/2018 |
| JP | 2019-129250 A | 8/2019 |

OTHER PUBLICATIONS

An Office Action; mailed by the China National Intellectual Property Administration of the People's Republic of China on Sep. 18, 2024, which corresponds to Chinese Patent Application No. 202080104927.3 and is related to U.S. Appl. No. 17/999,359.
International Search Report issued in PCT/JP2020/027586; mailed Sep. 29, 2020.

* cited by examiner

POWER SEMICONDUCTOR DEVICE INCLUDING A SUBSTRATE AND AN ELECTRODE HAVING MULTIPLE LAYERS WITH ONE OF THE UPPER LAYERS BEING IN DIRECT CONTACT WITH A PORTION OF THE SURFACE OF THE SUBSTRATE

TECHNICAL FIELD

The present disclosure relates to a power semiconductor device, and particularly relates to a power semiconductor device including a silicon substrate.

BACKGROUND ART

A reverse conducting insulated gate bipolar transistor (RC-IGBT) in which an insulated gate bipolar transistor (IGBT) and a freewheeling diode are integrated into one chip is known as a type of power semiconductor device. The RC-IGBT is used as, for example, a switching element for an inverter.

According to Japanese Patent Application Laid-Open No. 2013-48230 (Patent Document 1), a semiconductor device includes a metal collector/cathode electrode formed on a lower surface of a silicon substrate, and a metal emitter/anode electrode formed on an upper surface of the silicon substrate. The collector/cathode electrode is ohmically contacted to the silicon substrate. The emitter/anode electrode has a portion ohmically contacted to the silicon substrate, and a portion Schottky-contacted to the silicon substrate.

PRIOR ART DOCUMENT

Patent Document

Patent Document 1: Japanese Patent Application Laid-Open No. 2013-48230

SUMMARY

Problem to be Solved by the Invention

If a pure aluminum (Al) layer is contacted to a silicon substrate, Al spikes are likely to be generated in the silicon substrate due to diffusion of Al atoms from the pure Al layer. As a representative method for preventing the generation of Al spikes, there is a method in which an aluminum-silicon (Al—Si) layer (an alloy layer including the Al element as a main component and the Si element as an element added to the Al element) is used instead of the pure Al layer. However, in that case, Si atoms that have diffused from the Al—Si layer precipitate on the silicon substrate, so that Si nodules are likely to be generated. Both the Al spikes and the Si nodules may adversely affect the electrical characteristics of the power semiconductor device. The generation of Al spikes and Si nodules is prevented by inserting a barrier metal layer, in which Al atoms and Si atoms are less likely to diffuse, between the electrode and the silicon substrate. A contact between such a barrier metal layer and the silicon substrate tends to be an ohmic contact instead of a Schottky contact. For example, TiSi, which is silicide, is formed between a Ti layer, which is a typical barrier metal layer, and a silicon substrate, and as a result, the contact between the Ti layer and the silicon substrate becomes ohmic. Therefore, in a case where the generation of Al spikes and Si nodules is prevented only by simply providing a barrier metal layer, all the contacts become ohmic. Therefore, a Schottky barrier diode cannot be used as a freewheeling diode of an RC-IGBT.

The present disclosure has been made to solve the above problem, and an object thereof is to provide a power semiconductor device capable of suppressing the generation of Al spikes and Si nodules while an IGBT element and a Schottky barrier diode element are integrated.

Means to Solve the Problem

A power semiconductor device of one aspect according to the present disclosure includes a silicon substrate, a gate insulating film, a gate electrode, a first electrode, a barrier metal layer, and a second electrode. The silicon substrate has a first surface, and a second surface that is opposite the first surface and has a first portion and a second portion. The silicon substrate has a first semiconductor region that has a first conductivity type, a second semiconductor region that has a second conductivity type different from the first conductivity type, a third semiconductor region that has the first conductivity type, and is separated from the first semiconductor region by the second semiconductor region, and a fourth semiconductor region that has the second conductivity type, and is separated from the second semiconductor region by the third semiconductor region. The gate insulating film extends between the first semiconductor region and the third semiconductor region, and faces the second semiconductor region. The gate electrode faces the second semiconductor region with the gate insulating film interposed therebetween. The first electrode is provided on the first surface of the silicon substrate, and is in contact with the third semiconductor region and the fourth semiconductor region. The barrier metal layer is provided on the first portion of the second surface of the silicon substrate. The second electrode is provided on the second surface of the silicon substrate, and is separated from the first portion of the second surface of the silicon substrate by the barrier metal layer. The second electrode includes an aluminum-silicon (Al—Si) layer in contact with the second portion of the second surface of the silicon substrate, and an Al layer separated from the second portion of the second surface of the silicon substrate by the Al—Si layer.

A power semiconductor device of another aspect according to the present disclosure includes a silicon substrate, a gate insulating film, a gate electrode, a first electrode, a barrier metal layer, a second electrode, and a polycrystalline silicon layer. The silicon substrate has a first surface, and a second surface that is opposite the first surface and has a first portion and a second portion. The silicon substrate has a first semiconductor region that has a first conductivity type, a second semiconductor region that has a second conductivity type different from the first conductivity type, a third semiconductor region that has the first conductivity type, and is separated from the first semiconductor region by the second semiconductor region, and a fourth semiconductor region that has the second conductivity type, and is separated from the second semiconductor region by the third semiconductor region. The gate insulating film extends between the first semiconductor region and the third semiconductor region, and faces the second semiconductor region. The gate electrode faces the second semiconductor region with the gate insulating film interposed therebetween. The first electrode is provided on the first surface of the silicon substrate, and is in contact with the third semiconductor region and the fourth semiconductor region. The barrier metal layer is provided on the first portion of the second surface of the silicon substrate. The second electrode is provided on the second surface of the silicon substrate, and is separated from the first portion of the second surface of the silicon substrate by the barrier metal layer. The second electrode includes an Al—Si layer in contact with the second portion of the second surface of the silicon substrate. The polycrystalline silicon layer is in contact with the second electrode, away from the second surface of the silicon substrate.

Effects of the Invention

According to the power semiconductor device of the one aspect according to the present disclosure, the second electrode is ohmically contacted to the first portion of the second surface of the silicon substrate with the barrier metal layer interposed therebetween, and is Schottky-contacted to the second portion of the second surface of the silicon substrate using the Al—Si layer. As a result, the second electrode can function as an ohmic electrode for an IGBT element on the first portion of the second surface of the silicon substrate, and can function as a Schottky electrode for a Schottky barrier diode element on the second portion of the second surface of the silicon substrate. In addition, the barrier metal layer can suppress the generation of Si nodules and Al spikes in the first portion of the second surface of the silicon substrate. Furthermore, since the Al layer is separated from the second portion of the second surface of the silicon substrate by the Al—Si layer, the generation of Al spikes in the second portion of the second surface of the silicon substrate can be suppressed. Furthermore, since the second electrode includes the Al layer, the Si content of the second electrode can be suppressed as compared with a case where the second electrode of an Al-based material (material containing Al as a main component) is constituted by only an Al—Si layer, and thus the generation of Si nodules in the second portion of the second surface of the silicon substrate can be suppressed. From the above, in the power semiconductor device in which an IGBT element and a Schottky barrier diode element are integrated, the generation of Al spikes and Si nodules can be suppressed.

According to the power semiconductor device of the another aspect according to the present disclosure, the second electrode is ohmically contacted to the first portion of the second surface of the silicon substrate with the barrier metal layer interposed therebetween, and is Schottky-contacted to the second portion of the second surface of the silicon substrate using the Al—Si layer. As a result, the second electrode can function as an ohmic electrode for an IGBT element on the first portion of the second surface of the silicon substrate, and can function as a Schottky electrode for a Schottky barrier diode element on the second portion of the second surface of the silicon substrate. In addition, the barrier metal layer can suppress the generation of Si nodules in the first portion of the second surface of the silicon substrate. In addition, the polycrystalline silicon layer that is in contact with the second electrode, away from the second surface of the silicon substrate is provided. As a result, at least part of Si atoms that have diffused from the Al—Si layer generate Si nodules on a surface of the polycrystalline silicon layer instead of generating Si nodules on a surface of the silicon substrate. As a result, the generation of Si nodules can be suppressed.

Objects, features, aspects, and advantages of the present disclosure will become more apparent from the following detailed description and the accompanying drawings.

DESCRIPTION OF EMBODIMENTS

Figure 1:
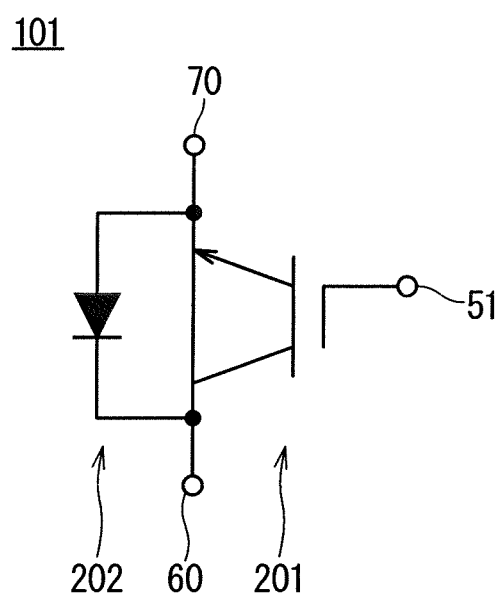
FIG. 1 is a circuit diagram schematically showing a configuration of a power semiconductor device in a first embodiment.

Hereinafter, embodiments will be described on the basis of the drawings. Note that in the following drawings, the same or corresponding portions are denoted by the same reference numerals, and the description thereof will not be repeated.

First Embodiment

FIG. 1 is a circuit diagram schematically showing a configuration of an RC-IGBT 101 (power semiconductor device) in a first embodiment. The RC-IGBT 101 is a power semiconductor device in which an IGBT element 201 and a Schottky barrier diode element 202 are integrated into one chip. The Schottky barrier diode element 202 has a function as a freewheeling diode by being connected in antiparallel to the IGBT element 201. The RC-IGBT 101 includes a gate electrode 51, a first electrode 60, and a second electrode 70. The first electrode 60 has a function as a collector electrode of the IGBT element 201 and a function as a cathode electrode of the Schottky barrier diode element 202. The second electrode 70 has a function as an emitter electrode of the IGBT element 201 and a function as an anode electrode of the Schottky barrier diode element 202. Note that although the details will be described later, the freewheeling diode of the RC-IGBT 101 does not need to be constituted by only the Schottky barrier diode element 202, and another diode element may be combined.

Figure 2:
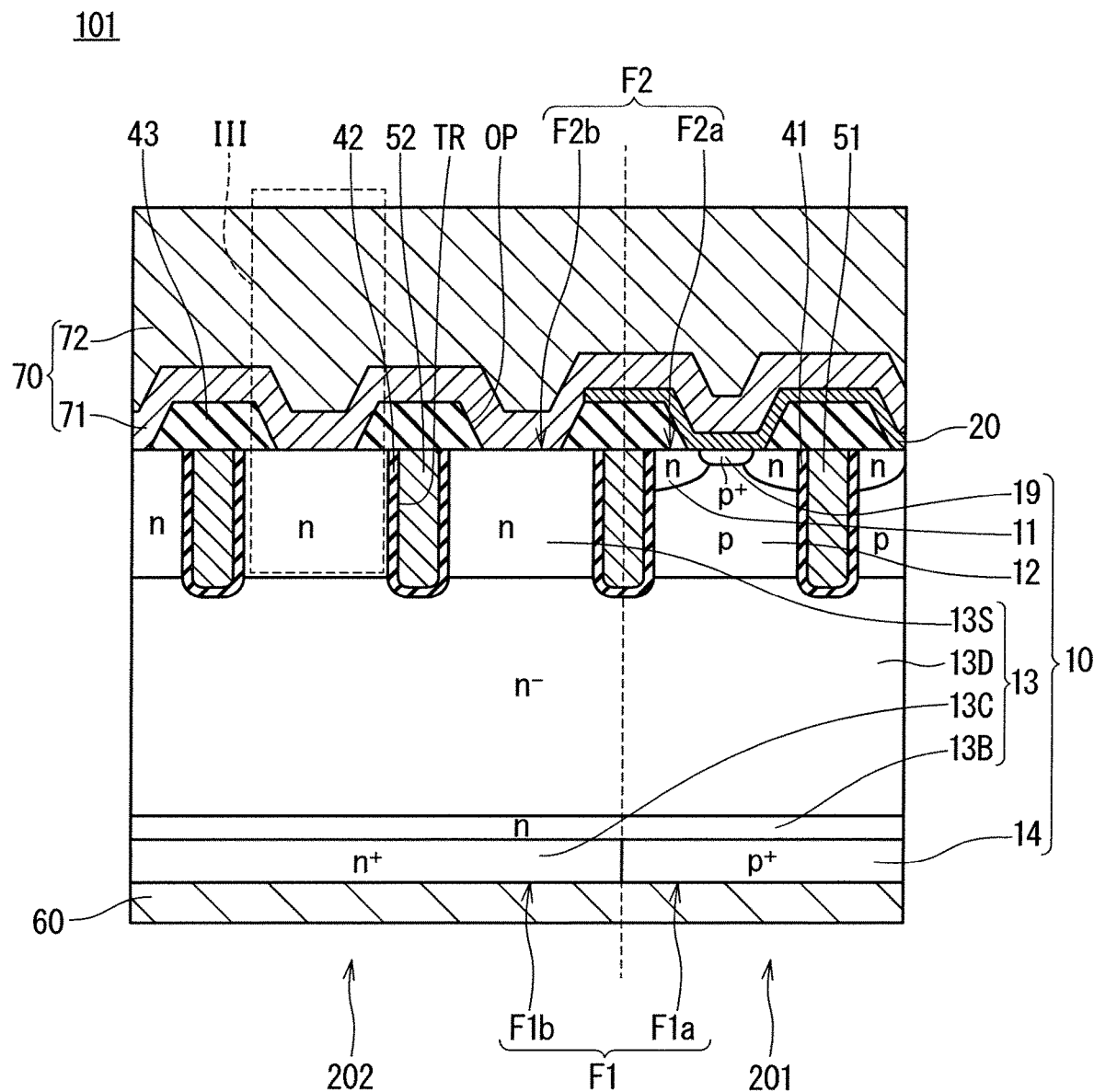
FIG. 2 is a cross sectional view schematically showing a configuration of the power semiconductor device in the first embodiment.

FIG. 2 is a cross sectional view schematically showing a configuration of the RC-IGBT 101. The RC-IGBT 101 includes a silicon substrate 10, a gate insulating film 41, the gate electrode 51, a barrier metal layer 20, and an interlayer insulating film 43. The silicon substrate 10 has a lower surface F1 (first surface) and an upper surface F2 (second surface opposite the first surface). The lower surface F1 includes an IGBT lower surface portion F1a and a diode lower surface portion F1b. The upper surface F2 includes an IGBT upper surface portion F2a (first portion) and a diode upper surface portion F2b (second portion). Note that FIG. 2 shows a configuration in which the boundary between the IGBT lower surface portion F1a and the diode lower surface portion F1b and the boundary between the IGBT upper surface portion F2a and the diode upper surface portion F2b coincide with each other in an in-plane direction. However, as a modification, these boundaries may be shifted from each other.

The silicon substrate 10 includes a first semiconductor region 11 having the n type (first conductivity type), a second semiconductor region 12 having the p type (second conductivity type different from the first conductivity type), a third semiconductor region 13 having the n type, a fourth semiconductor region 14 having the p type, and a $p^+$ contact region 19 having the p type. The third semiconductor region 13 is separated from the first semiconductor region 11 by the second semiconductor region 12. The fourth semiconductor region 14 is separated from the second semiconductor region 12 by the third semiconductor region 13.

The first semiconductor region 11 is an n emitter region of the IGBT element 201, and forms part of the IGBT upper surface portion F2a. The second semiconductor region 12 is a p body region of the IGBT element 201. The third semiconductor region 13 includes an $n^-$ drift layer 13D, an n buffer layer 13B, an n Schottky contact layer 13S of the Schottky barrier diode element 202, and an $n^+$ contact layer 13C of the Schottky barrier diode element 202. The fourth semiconductor region 14 is a $p^+$ collector region of the IGBT element 201, and forms the IGBT lower surface portion F1a. The $p^+$ contact region 19 extends from the IGBT upper surface portion F2a and reaches the second semiconductor region (p body region). The impurity concentration of the $p^+$ contact region 19 is higher than the impurity concentration of the second semiconductor region (p body region).

A trench TR is provided in each of the IGBT upper surface portion F2a and the diode upper surface portion F2b of the silicon substrate 10. Furthermore, on the IGBT upper surface portion F2a and on the diode upper surface portion F2b of the silicon substrate 10, the interlayer insulating film 43 that covers the trenches TR in a cross sectional view (the field of view in FIG. 2) is provided. The interlayer insulating film 43 may be an oxide film, and is, for example, a silicon oxide film. A gate electrode 51 is disposed in the trench TR of the IGBT upper surface portion F2a with a gate insulating film 41 interposed therebetween. The gate electrode 51 is insulated from the laminate of the barrier metal layer 20 and the second electrode 70 by the interlayer insulating film 43. A dummy electrode 52 is disposed in the trench TR of the diode upper surface portion F2b with a dummy insulating film 42 interposed therebetween. Preferably, a structure (not shown) for electrically connecting (typically short-circuiting) the dummy electrode 52 and the second electrode 70 to each other is provided. The gate insulating film 41 extends between the first semiconductor region 11 (n emitter region) and the third semiconductor region 13 ($n^-$ drift layer 13D), and faces the second semiconductor region 12 (p body region). The gate electrode 51 faces the second semiconductor region 12 (p body region) with the gate insulating film 41 interposed therebetween.

The first electrode 60 is provided on the lower surface F1 of the silicon substrate 10. Furthermore, the first electrode 60 is in contact with the $n^+$ contact layer 13C of the third semiconductor region 13, and the fourth semiconductor region 14 ($p^+$ collector region), so that the first electrode 60 is ohmically contacted to each of the $n^+$ contact layer 13C of the third semiconductor region 13 and the fourth semiconductor region 14 ($p^+$ collector region).

The barrier metal layer 20 is provided on the IGBT upper surface portion F2a of the silicon substrate 10. The barrier metal layer 20 is made of a material suitable for suppressing diffusion of aluminum (Al) atoms and silicon (Si) atoms. The material is, for example, titanium (Ti), titanium nitride (TiN), titanium silicide (TiSi), titanium tungsten (TiW), or a composite material using two or more of these materials. The barrier metal layer 20 is ohmically contacted to each of the first semiconductor region 11 (n emitter region) and the $p^+$ contact region 19, on the IGBT upper surface portion F2a. The reason why this contact is ohmic is that silicides are formed between the barrier metal layer 20 and the silicon substrate 10.

The second electrode 70 is provided on the upper surface F2 of the silicon substrate 10 and is separated from the IGBT upper surface portion F2a by the barrier metal layer 20. The second electrode 70 includes an Al—Si layer 71 and an Al layer 72. The Al—Si layer 71 is in contact with the diode upper surface portion F2b of the silicon substrate 10. The Al layer 72 is separated from the diode upper surface portion F2b of the silicon substrate 10 by the Al—Si layer 71.

The second electrode 70 has a laminated structure of the Al—Si layer 71 and the Al layer 72 at least on the diode upper surface portion F2b of the silicon substrate 10. As shown in FIG. 2, the second electrode 70 also has a laminated structure of the Al—Si layer 71 and the Al layer 72 on the IGBT upper surface portion F2a of the silicon substrate 10, and in this case, the Al—Si layer 71 and the Al layer 72 may have a common pattern in the in-plane direction. The laminated structure of the Al—Si layer 71 and the Al layer 72 is made of an Al-based material, and thus has a high cushion characteristic (stress relaxation characteristic). Therefore, making the thickness of the laminated structure sufficient can sufficiently secure the cushion characteristic required for alleviating the stress caused by bonding on the second electrode 70 or the like. From this viewpoint, preferably, the thickness of the laminated structure, that is, the total thickness of the Al—Si layer 71 and the Al layer 72, is 3 μm or more. Note that the thickness may be usually 7 μm or less.

Here, the Al—Si layer is defined as a layer made of an alloy in which 0.5 wt % or more and 3 wt % or less Si is added to Al as a main component. In the Al—Si layer, it is preferable that substantially no element except Si is added to Al as a main component, and in this case, the Al—Si layer is made of a binary alloy of Al and Si. Furthermore, the Al layer is defined as a layer containing Al as a main component and having a Si content of 0.3 wt % or less. If Al containing only impurity elements of 0.3 wt % or less is defined as pure Al, the Al layer may be a pure Al layer. Note that in the laminated structure of the Al—Si layer and the Al layer, between the Al—Si layer and the Al layer, a region having an intermediate composition between the composition of the Al—Si layer and the composition of the Al layer may be formed due to atomic diffusion or the like.

Figure 3:
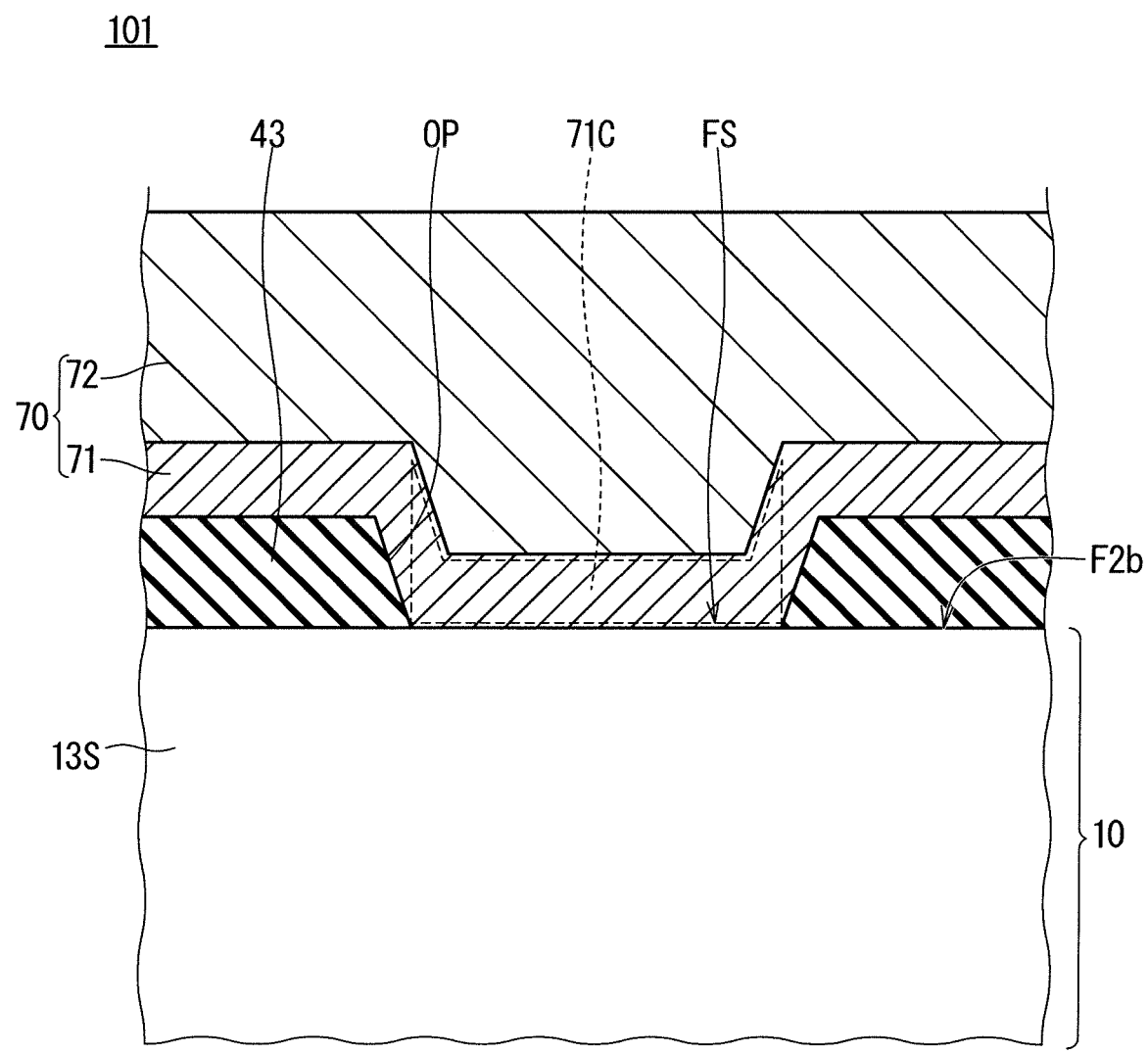
FIG. 3 is a partial cross sectional view showing a region III in FIG. 2.

FIG. 3 is a partial cross sectional view showing a region III in FIG. 2. The Al—Si layer 71 has a contact portion 71C that is disposed in an opening OP of the interlayer insulating film 43 in the in-plane direction (a lateral direction in FIG. 3) and is in direct contact with the diode upper surface portion F2b of the silicon substrate 10. The contact portion 71C is a portion of the Al—Si layer 71 located over an interface FS between the Al—Si layer 71 and the silicon substrate 10 in a thickness direction. The Al layer 72 has a portion disposed on the contact portion 71C of the Al—Si layer 71. In other words, the Al layer 72 has a portion laminated on the contact portion 71C of the Al—Si layer 71 in the thickness direction (vertical direction in FIG. 3).

Figure 4:
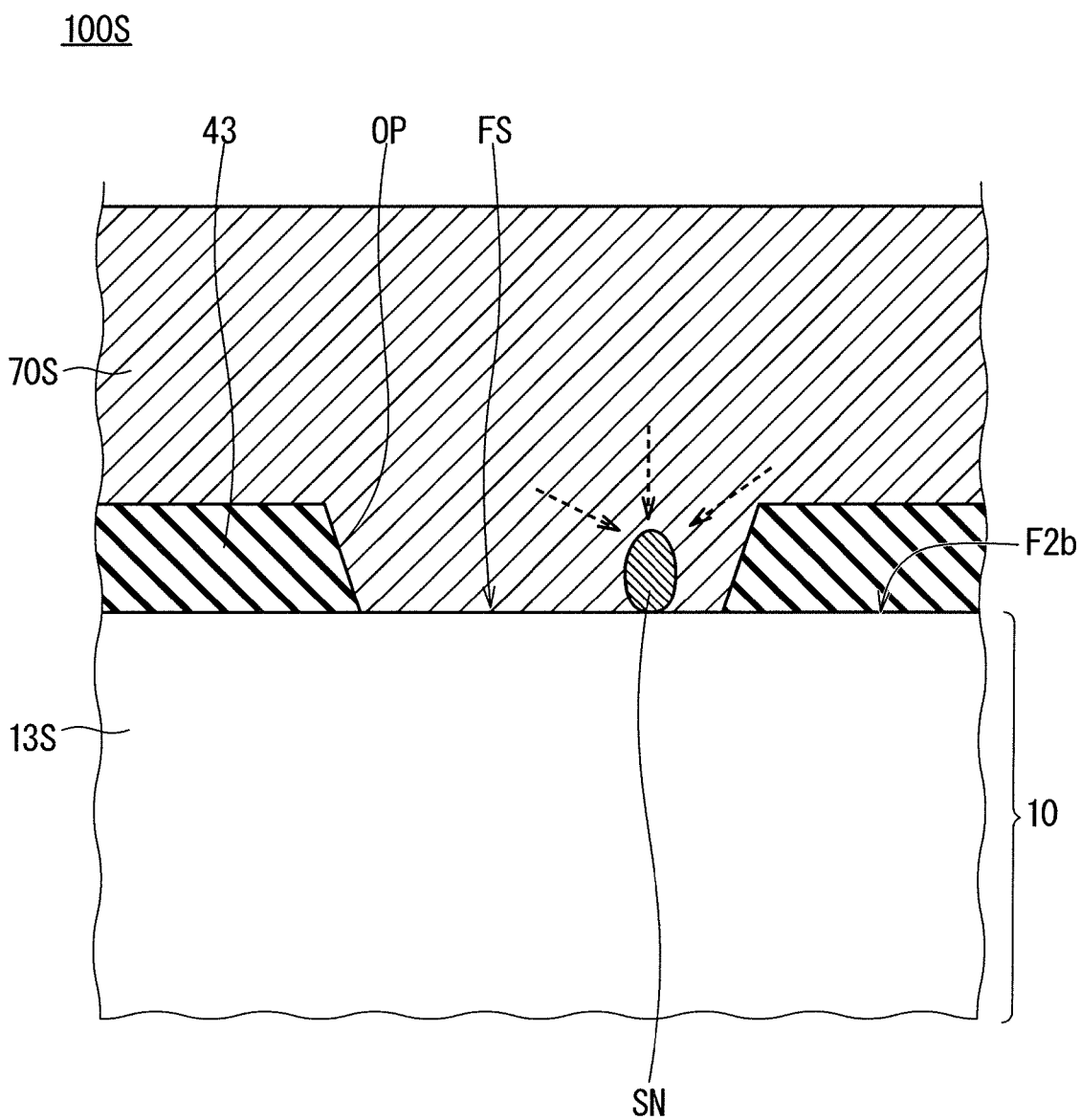
FIG. 4 is a partial cross sectional view showing a first comparative example in a field of view corresponding to FIG. 3.

FIG. 4 is a partial cross sectional view showing an RC-IGBT 100S in a first comparative example in a field of view corresponding to FIG. 3. In the present comparative example, an entire second electrode 70S is constituted by an Al—Si layer. The Al—Si layer is typically formed by sputter deposition. Preferably, the sputter deposition is performed while heating a silicon substrate 10. Furthermore, heat treatment may be performed after the Al—Si layer is deposited. In either case, the Al—Si layer undergoes a temperature change that falls from a high temperature to a room temperature. During this temperature fall, Si in the Al—Si layer precipitates on an interface FS between the Al—Si layer and the silicon substrate 10 (see broken-line arrows in the drawing), and thus a Si nodule SN is generated. Since in the present comparative example, the entire second electrode 70S is the Al—Si layer, the Si content of the second electrode 70S is high, and thus Si nodules SN are likely to be generated. The thickness (dimension in a vertical direction in FIG. 4) of the Si nodule SN reaches, for example, about 1 μm.

When thermal expansion and contraction due to a temperature change in a use environment or an external force due to a bonding process on the second electrode 70S is applied, stress concentration is likely to occur at a place where a Si nodule SN is formed in a diode upper surface portion F2*b* of the silicon substrate 10 since the Si nodule SN is harder than the second electrode 70S made of an Al-based material. As a result of this stress concentration, first, local crystallinity deterioration (local variation in Si interatomic distance in the silicon substrate 10) may occur. As the band structure varies due to the deterioration of crystallinity, a Schottky characteristic varies. As a result, the rectification characteristic of the Schottky barrier diode element deteriorates. More specifically, a forward voltage drop or a reverse-withstood-voltage leak current increases. Second, the flatness of an IGBT upper surface portion F2*a* of the silicon substrate 10 may deteriorate, in other words, the IGBT upper surface portion F2*a* may be damaged. When the IGBT element in an OFF state holds a high voltage, the electric field tends to concentrate on the place where the flatness deteriorates. As a result, a withstood-voltage leak current increases. If as described above, the entire second electrode 70S is constituted by the Al—Si layer, the electrical characteristics of the RC-IGBT 101 are likely to deteriorate.

Figure 5:
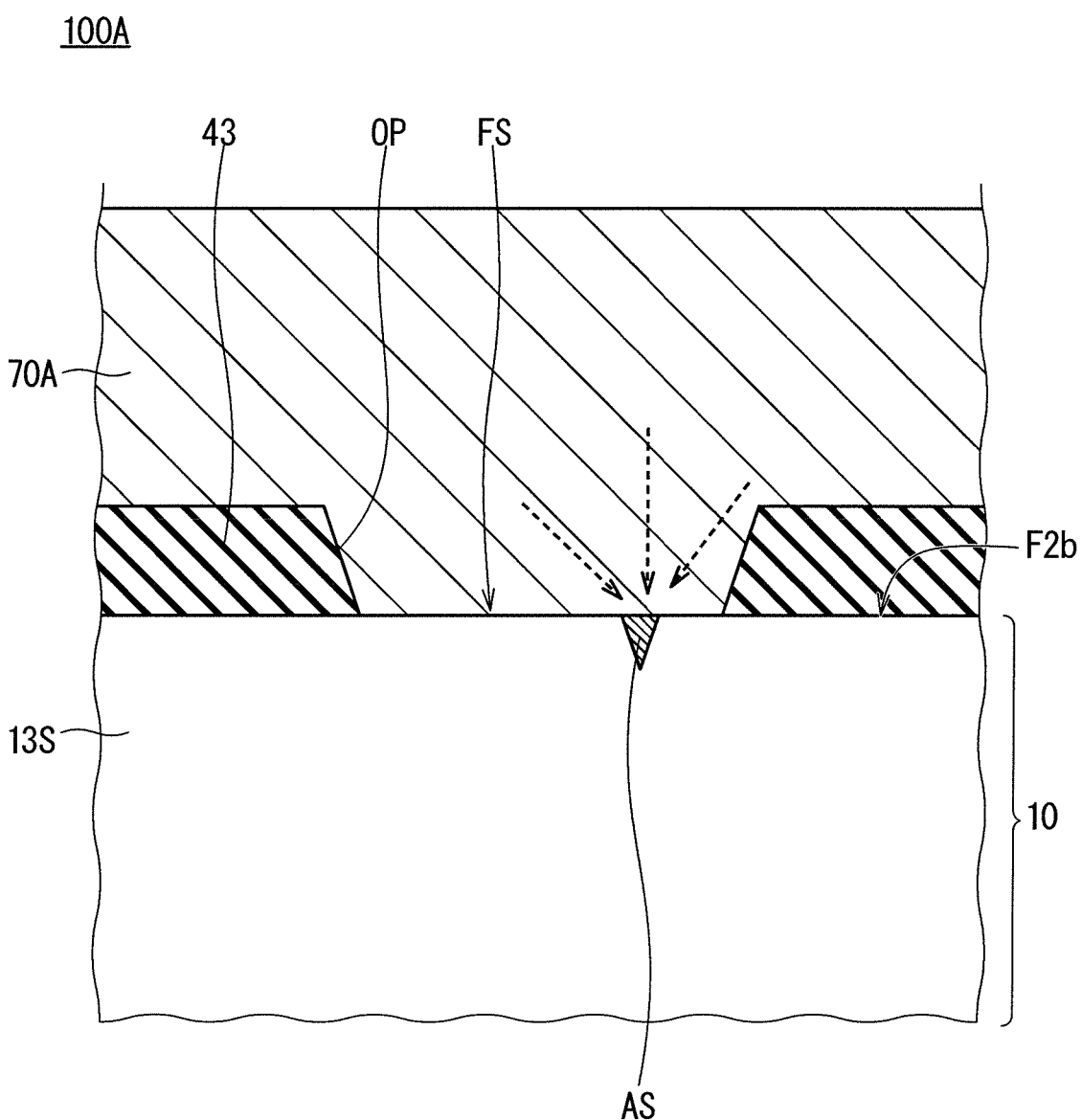
FIG. 5 is a partial cross sectional view showing a second comparative example in a field of view corresponding to FIG. 3.

FIG. 5 is a partial cross sectional view showing an RC-IGBT 100A in a second comparative example in a field of view corresponding to FIG. 3. In the present comparative example, an entire second electrode 70A is constituted by an Al layer. Therefore, an alloying reaction between Si atoms of a silicon substrate 10 and Al atoms of the Al layer easily occurs at high temperatures. As a result, an Al spike AS is likely to be generated at an interface FS. Similarly to the Si nodule SN (FIG. 4), the Al spike AS causes the electrical characteristics of the RC-IGBT 101 to deteriorate.

In the RC-IGBT 101 of the present embodiment, the thickness of the Al—Si layer 71 is desirably not excessively large to prevent the generation of the Si nodule SN (FIG. 4), and is desirably not excessively small to prevent the generation of the Al spike AS (FIG. 5). From this viewpoint, preferably, the thickness of the Al—Si layer 71 is 0.5 μm or more and 2 μm or less. On the other hand, it is difficult to secure a sufficient cushion property only with the Al—Si layer 71 having a thickness of 0.5 μm or more and 2 μm or less, and in order to compensate for this, preferably, the thickness of the Al layer 72 is 1 μm or more. Note that the thickness of the Al layer 72 may be usually 5 μm or less.

Next, an example of a method for forming the second electrode 70 in the present first embodiment will be briefly described. First, a silicon substrate 10 having an upper surface F2 provided with an interlayer insulating film 43 is prepared. At this point, the doping of the silicon substrate 10 and the formation of trenches TR may be completed. The application of pattern shapes to the interlayer insulating film 43 may be performed by lift-off, or by photolithography and etching. Next, a barrier metal layer 20 is formed on an IGBT upper surface portion F2*a* of the upper surface F2. As shown in FIG. 2, the pattern of the barrier metal layer 20 is disposed on the IGBT upper surface portion F2*a* and is apart from at least part of a diode upper surface portion F2*b*. Such application of the pattern shapes to the barrier metal layer 20 can be performed by lift-off, or by photolithography and etching. Next, an Al—Si layer 71 and an Al layer 72 are formed on the upper surface F2 by sputtering. Thus, a second electrode 70 is formed.

According to the present embodiment, the second electrode 70 (FIG. 2) is ohmically contacted to the IGBT upper surface portion F2*a* of the silicon substrate 10 with the barrier metal layer 20 interposed therebetween, and is Schottky-contacted to the diode upper surface portion F2*b* of the silicon substrate 10 using the Al—Si layer. As a result, the second electrode 70 can function as an ohmic electrode for the IGBT element 201 on the IGBT upper surface portion F2*a* of the silicon substrate 10, and can function as a Schottky electrode for the Schottky barrier diode element 202 on the diode upper surface portion F2*b* of the silicon substrate 10. In addition, the barrier metal layer 20 can suppress the generation of Si nodules and Al spikes in the IGBT upper surface portion F2*a* of the silicon substrate 10. Furthermore, since the Al layer 72 is separated from the diode upper surface portion F2*b* of the silicon substrate 10 by the Al—Si layer, the generation of Al spikes AS (FIG. 5) in the diode upper surface portion F2*b* of the silicon substrate 10 can be suppressed. Furthermore, since the second electrode 70 includes the Al layer 72, the Si content of the second electrode 70 can be suppressed as compared with a case where the second electrode 70 of an Al-based material is constituted by only an Al—Si layer, and thus the generation of Si nodules SN (FIG. 4) in the diode upper surface portion F2*b* of the silicon substrate 10 can be suppressed. From the above, in the power semiconductor device in which the IGBT element 201 and the Schottky barrier diode element 202 are integrated, the generation of Al spikes and Si nodules can be suppressed.

The second electrode 70 has a laminated structure of the Al—Si layer that is a layer substantially containing Si atoms and the Al layer 72 that is a layer containing substantially no Al atom, at least on the diode upper surface portion F2*b* of the silicon substrate 10. This makes it possible to suppress the Si content in the second electrode 70 while securing the thickness of the second electrode 70 of an Al-based material. Therefore, the generation of Si nodules can be suppressed.

In a region on the diode upper surface portion F2*b* of the silicon substrate 10, a portion where the interlayer insulating film 43 (FIG. 2) is disposed does not act as a diffusion source of Si atoms. Therefore, the generation of Si nodules can be further suppressed.

The Al layer 72 has a portion disposed on the contact portion 71C (FIG. 3) of the Al—Si layer. As a result, a portion of the second electrode 70 on the contact portion 71C does not substantially act as a diffusion source of Si atoms. Therefore, the generation of Si nodules can be further suppressed.

Each of the IGBT upper surface portion F2a and the diode upper surface portion F2b of the silicon substrate 10 is provided with the trench TR (FIG. 2) covered with the interlayer insulating film 43 in a cross sectional view. As a result, the interlayer insulating film 43 can be used not only as a configuration for suppressing the generation of Si nodules but also as a configuration for insulating the trenches TR.

Note that in the RC-IGBT 101, in addition to the Schottky barrier diode element 202, another diode element may also function as a freewheeling diode. For example, in the RC-IGBT 101, a pn junction is formed by the third semiconductor region 13 having the n type and the second semiconductor region 12 and the contact region 19 having the p type, and the first electrode 60 and the barrier metal layer 20 are ohmically connected to the third semiconductor region having the n type and the contact region 19 having the p type, respectively. As a result, a pn junction diode element connected in anti-parallel to the IGBT element 201 is configured between the first electrode 60 and the second electrode 70. The pn junction diode element may function as a freewheeling diode together with the Schottky barrier diode element 202.

Furthermore, in the RC-IGBT 101, the trench TR is formed not only in the IGBT upper surface portion F1a but also in the diode upper surface portion F2b, but the trench TR in the diode upper surface portion F2b may be omitted. In that case, the dummy insulating film 42 and the dummy electrode 52 may also be omitted.

Second Embodiment

Figure 6:
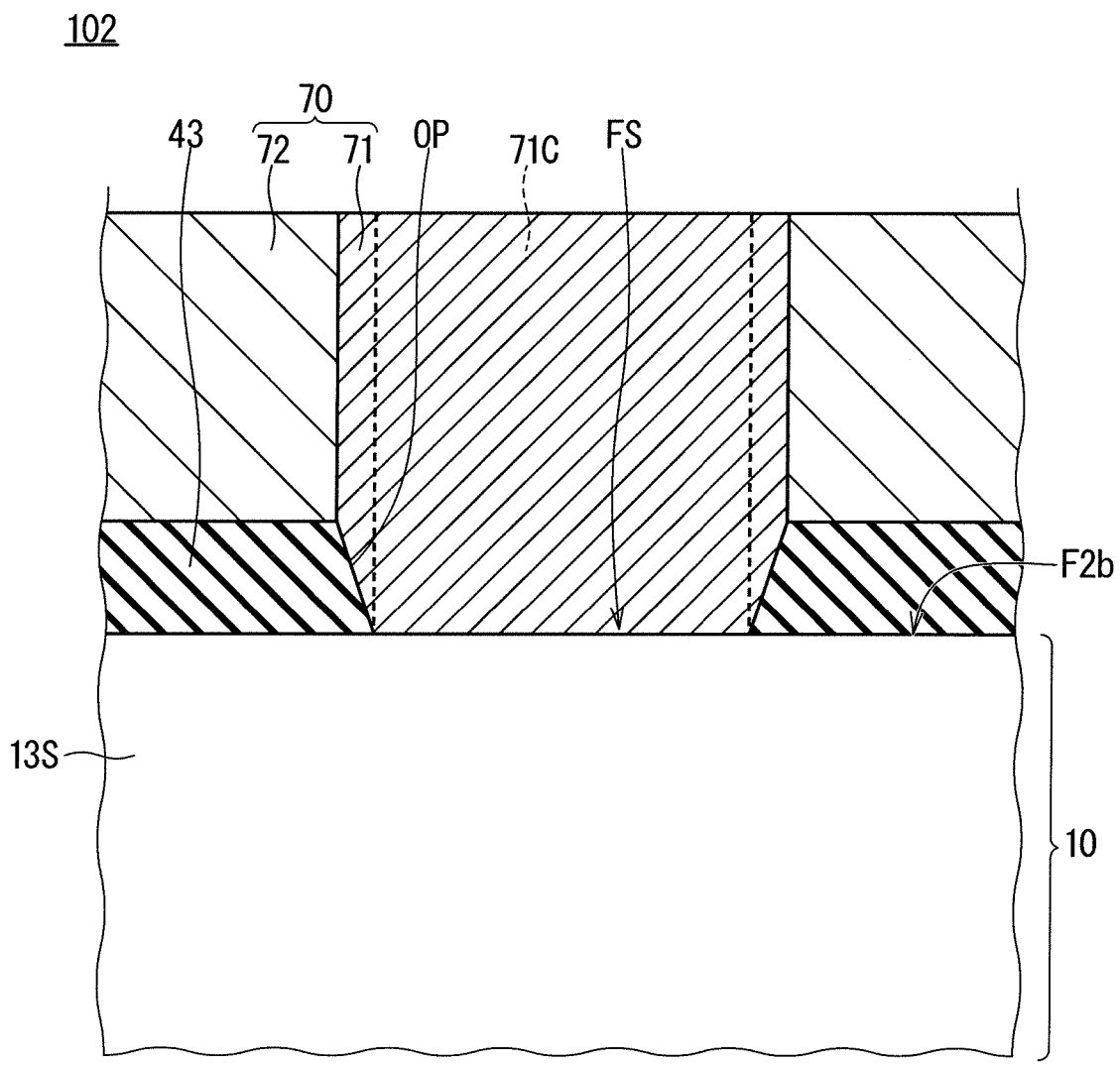
FIG. 6 is a partial cross sectional view schematically showing a configuration of a power semiconductor device in a second embodiment in a field of view corresponding to FIG. 3.

FIG. 6 is a partial cross sectional view schematically showing a configuration of an RC-IGBT 102 (power semiconductor device) in a second embodiment in a field of view corresponding to FIG. 3 (the first embodiment). In the present second embodiment, at least part of an Al layer 72 is disposed directly on an interlayer insulating film 43. In the example shown in FIG. 6, the Al layer 72 is disposed directly on the entire upper surface of the interlayer insulating film 43. Furthermore, in the present second embodiment, unlike the above-described first embodiment, the Al layer 72 does not have a portion disposed on a contact portion 71C of an Al—Si layer 71 (a portion disposed over the contact portion 71C of the Al—Si layer 71 in a thickness direction). In other words, the Al layer 72 is disposed apart from a region over an interface FS between the Al—Si layer 71 and a silicon substrate 10. In the example shown in FIG. 6, the Al layer 72 is disposed only outside a region surrounded by the upper end (end away from the silicon substrate 10) of a side wall around an opening OP of the interlayer insulating film 43 in an in-plane direction.

Note that in FIG. 6, only a portion of a second electrode 70 on a diode upper surface portion F2b is shown. A configuration of a portion of the second electrode 70 on an IGBT upper surface portion F2a (see FIG. 2) is optional, and may be, for example, a configuration similar to the configuration shown in FIG. 6.

Since the configuration except the above is substantially the same as the configuration of the first embodiment described above, the same or corresponding elements are denoted by the same reference numerals, and the description thereof will not be repeated.

Next, an example of a method for forming the second electrode 70 in the present second embodiment will be briefly described. First, as in the first embodiment, a barrier metal layer 20 is formed on an IGBT upper surface portion F2a of an upper surface F2 of a silicon substrate 10. Next, an Al—Si layer 71 is formed by deposition on the entire upper surface F2 by sputtering, and patterning of the layer formed by the deposition, by photolithography and etching. Next, an Al layer is formed by sputtering, and then unnecessary portions of the Al layer are removed by chemical mechanical polishing (CMP) to form an Al layer 72. Thus, a second electrode 70 is formed.

At least part of the Al layer 72 is disposed directly on an interlayer insulating film 43. As a result, the Si content of a portion of the second electrode 70 disposed directly on the interlayer insulating film 43 is suppressed. Therefore, the generation of Si nodules due to diffusion of Si atoms from the portion can be avoided.

Third Embodiment

Figure 7:
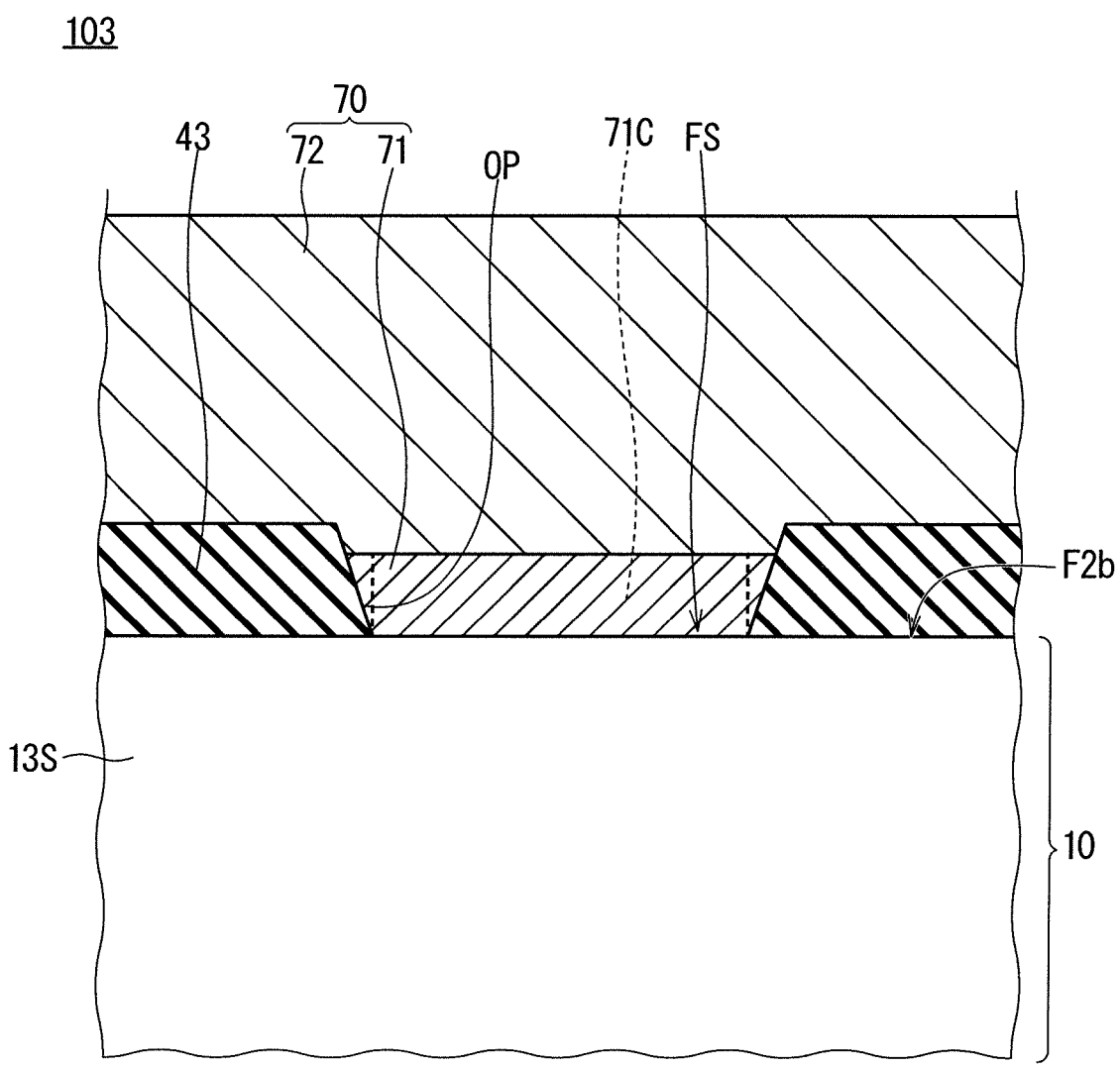
FIG. 7 is a partial cross sectional, view schematically showing a configuration of a power semiconductor device in a third embodiment in a field of view corresponding to FIG. 3.

FIG. 7 is a partial cross sectional view schematically showing a configuration of an RC-IGBT 103 (power semiconductor device) in a third embodiment in a field of view corresponding to FIG. 3.

In the present embodiment, an Al layer 72 has a portion disposed directly on an interlayer insulating film 43. In addition, the Al layer 72 has a portion disposed on an Al—Si layer 71, and particularly has a portion disposed on a contact portion 71C.

The Al—Si layer 71 is disposed only inside an opening OP of the interlayer insulating film 43 in a thickness direction. In other words, the Al—Si layer 71 is disposed only in a region surrounded by the upper end (end away from a silicon substrate 10) of a side wall around the opening OP of the interlayer insulating film 43 in an in-plane direction, and has a thickness equal to or less than the thickness of the interlayer insulating film 43 in the opening OP. The Al—Si layer 71 is separated from other adjacent Al—Si layers (not shown in FIG. 7) in a cross sectional view (FIG. 7). Furthermore, in a planar layout (not shown), preferably, the edge of the opening OP of the interlayer insulating film 43 has a closed shape, and in this case, the Al—Si layer 71 is separated from other adjacent Al—Si layers. In other words, the Al—Si layer 71 has a plurality of portions separated from each other.

Note that in FIG. 7, only a portion of a second electrode 70 on a diode upper surface portion F2b is shown. A configuration of a portion of the second electrode 70 on an IGBT upper surface portion F2a (see FIG. 2) is optional, and may be, for example, a configuration similar to the configuration shown in FIG. 7.

Since the configuration except the above is substantially the same as the configuration of the second embodiment described above, the same or corresponding elements are denoted by the same reference numerals, and the description thereof will not be repeated.

Next, a first method for forming the second electrode 70 in the present third embodiment will be briefly described. First, as in the first embodiment, a barrier metal layer 20 is formed on an IGBT upper surface portion F2a of an upper surface F2 of a silicon substrate 10. Next, an Al—Si layer 71 is formed by deposition on the entire upper surface F2 by sputtering, and patterning of the layer formed by the deposition, by photolithography and etching. Next, an Al layer 72 is formed by sputtering. Thus, a second electrode 70 is formed.

Next, a second method for forming the second electrode 70 in the present third embodiment will be briefly described. First, as in the first method, a barrier metal layer 20 is formed on an IGBT upper surface portion F2a of an upper surface F2 of a silicon substrate 10. Next, a resist film having an opening corresponding to an opening OP of an interlayer insulating film 43 is formed. Next, an Al—Si layer 71 is formed by deposition on the entire upper surface F2 by sputtering, and patterning of the layer formed by this deposition, by lift-off (in other words, patterning by removal of the resist film). Next, an Al layer 72 is formed by sputtering. Thus, a second electrode 70 is formed.

According to the present embodiment, part of the Al layer 72 is disposed directly on the interlayer insulating film 43. As a result, a portion of the second electrode 70 disposed directly on the interlayer insulating film 43 does not substantially act as a diffusion source of Si atoms. Therefore, the generation of Si nodules can be further suppressed.

The Al—Si layer is disposed only inside the opening OP of the interlayer insulating film 43 in the thickness direction. As a result, it is possible to avoid the generation of Si nodules due to diffusion of Si atoms from the outside of the opening OP.

Fourth Embodiment

Figure 8:
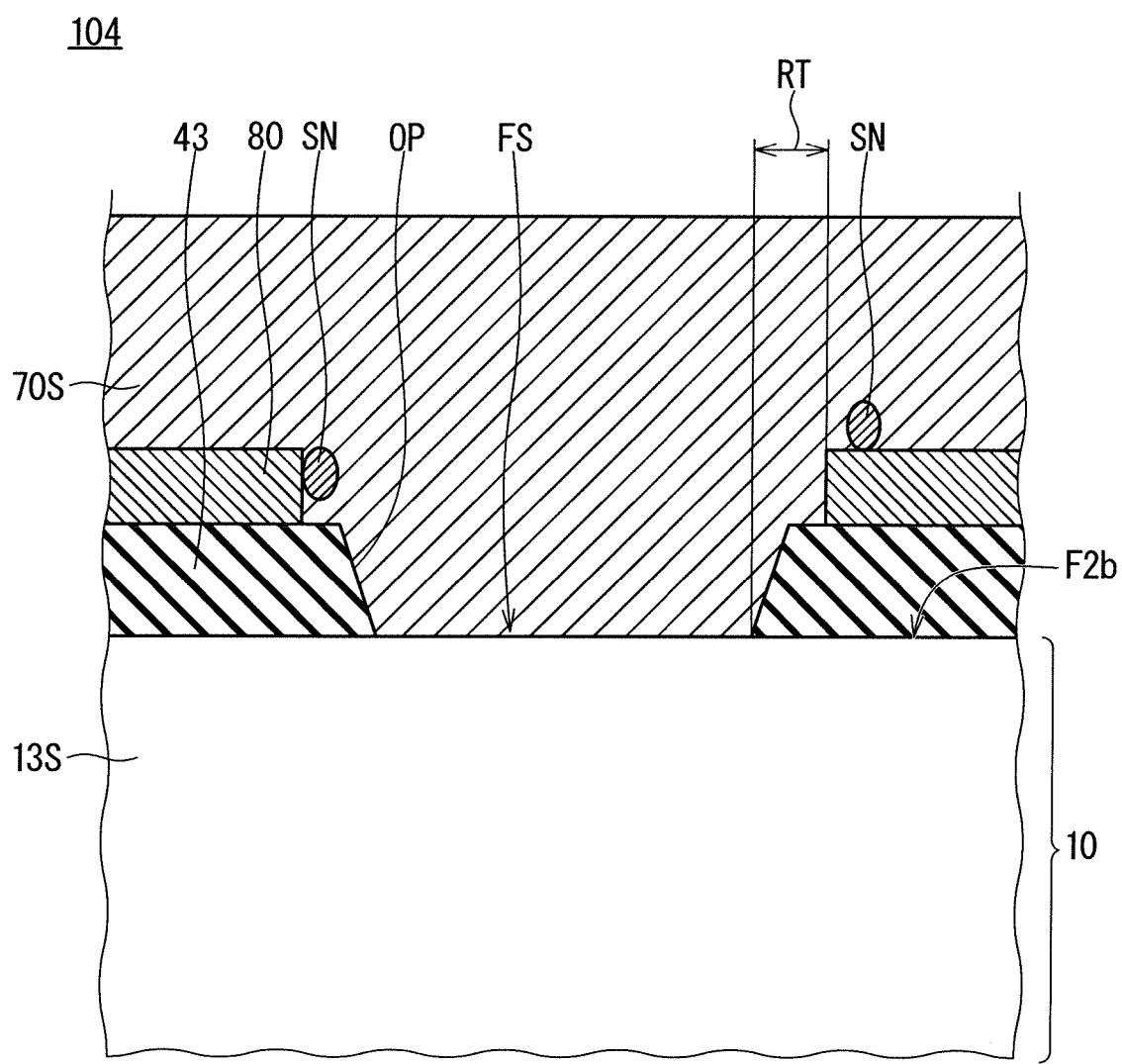
FIG. 8 is a partial cross sectional view schematically showing a configuration of a power semiconductor device in a fourth embodiment in a field of view corresponding to FIG. 3.

FIG. 8 is a partial cross sectional view schematically showing a configuration of an RC-IGBT 104 (power semiconductor device) in a fourth embodiment in a field of view corresponding to FIG. 3. As a difference from the RC-IGBT 101 (FIG. 2), the RC-IGBT 104 includes a second electrode 70S (FIG. 8) and a polycrystalline silicon layer 80 instead of the second electrode 70 (FIGS. 2 and 3). Since other configurations of the RC-IGBT 104 are substantially the same as the configurations of the first embodiment described above, the description thereof will not be repeated.

The second electrode 70S is provided on an upper surface F2 of a silicon substrate 10 similarly to the second electrode 70 (FIG. 2), and is separated from an IGBT upper surface portion F2a of the silicon substrate 10 by a barrier metal layer 20. On the other hand, the second electrode 70S includes an Al—Si layer in contact with a diode upper surface portion F2b of the silicon substrate 10, unlike the second electrode 70 (FIG. 2), and in the configuration shown in FIG. 8, the second electrode 70S is the Al—Si layer.

The polycrystalline silicon layer 80 (FIG. 8) is away from the upper surface F2 (see FIG. 2) of the silicon substrate 10, and is in contact with the second electrode 70S. In the example shown in FIG. 8, the polycrystalline silicon layer 80 is disposed on an upper surface of an interlayer insulating film 43 (a surface opposite the surface facing the silicon substrate 10), and is covered with the Al—Si layer as the second electrode 70S.

The RC-IGBT 104 may include Si nodules SN formed by precipitation of Si from the Al—Si layer of the second electrode 70S on the interface between the Al—Si layer and the polycrystalline silicon layer 80. In order to avoid an opening OP from being blocked by the Si nodules SN formed in the polycrystalline silicon layer 80, the polycrystalline silicon layer 80 may be disposed in such a manner that the polycrystalline silicon layer 80 is retracted from the opening OP of the interlayer insulating film 43 by a distance RT in an in-plane direction (a lateral direction in FIG. 8). The distance RT may be usually 1 μm or less.

Note that in FIG. 8, only a portion of the second electrode 70S on the diode upper surface portion F2b is shown. A configuration of a portion of the second electrode 70S on an IGBT upper surface portion F2a (see FIG. 2) is optional, and may be, for example, a configuration similar to the configuration shown in FIG. 8.

Next, an example of a method for forming the polycrystalline silicon layer 80 and the second electrode 70S in the present fourth embodiment will be briefly described. First, a silicon substrate 10 provided with an interlayer insulating film 43 is prepared. At this point, the doping of the silicon substrate 10 and the formation of trenches TR may be completed. The application of pattern shapes to the interlayer insulating film 43 may be performed by lift-off, or by photolithography and etching. Next, a polycrystalline silicon layer 80 is formed by deposition on an entire upper surface F2, and patterning of the layer formed by the deposition, by photolithography and etching. Next, a barrier metal layer 20 is formed on an IGBT upper surface portion F2a of the upper surface F2, as in the first embodiment described above. Next, an Al—Si layer as a second electrode 70S is formed on the upper surface F2 by sputtering. As described above, the polycrystalline silicon layer 80 and the second electrode 70S are formed.

Note that in a case where it is not necessary to control the distance RT, after deposition of a layer including a portion to be the interlayer insulating film 43 and deposition of a layer including a portion to be the polycrystalline silicon layer 80 are performed, both the layers may be collectively patterned. This simplifies the manufacturing method.

Also in the present fourth embodiment, for a similar reason as in the first embodiment, the second electrode 70S can function as an ohmic electrode for an IGBT element 201 (see FIGS. 1 and 2) on the IGBT upper surface portion F2a (see FIG. 2) of the upper surface F2 of the silicon substrate 10, and can function as a Schottky electrode for a Schottky barrier diode element 202 (see FIGS. 1 and 2) on the diode upper surface portion F2b of the silicon substrate 10. In addition, as in the first embodiment, the barrier metal layer 20 (FIG. 2) can suppress the generation of Si nodules in the IGBT upper surface portion F2a (FIG. 2) of the silicon substrate 10.

In addition, according to the present fourth embodiment, the polycrystalline silicon layer 80 that is in contact with the second electrode 70S, away from the upper surface F2 of the silicon substrate 10 is provided. As a result, at least part of Si atoms that have diffused from the Al—Si layer 70S generate Si nodules on a surface of the polycrystalline silicon layer 80 instead of generating Si nodules on a surface of the silicon substrate 10. As a result, the generation of Si nodules on the surface of the silicon substrate 10 can be suppressed.

Fifth Embodiment

Figure 9:
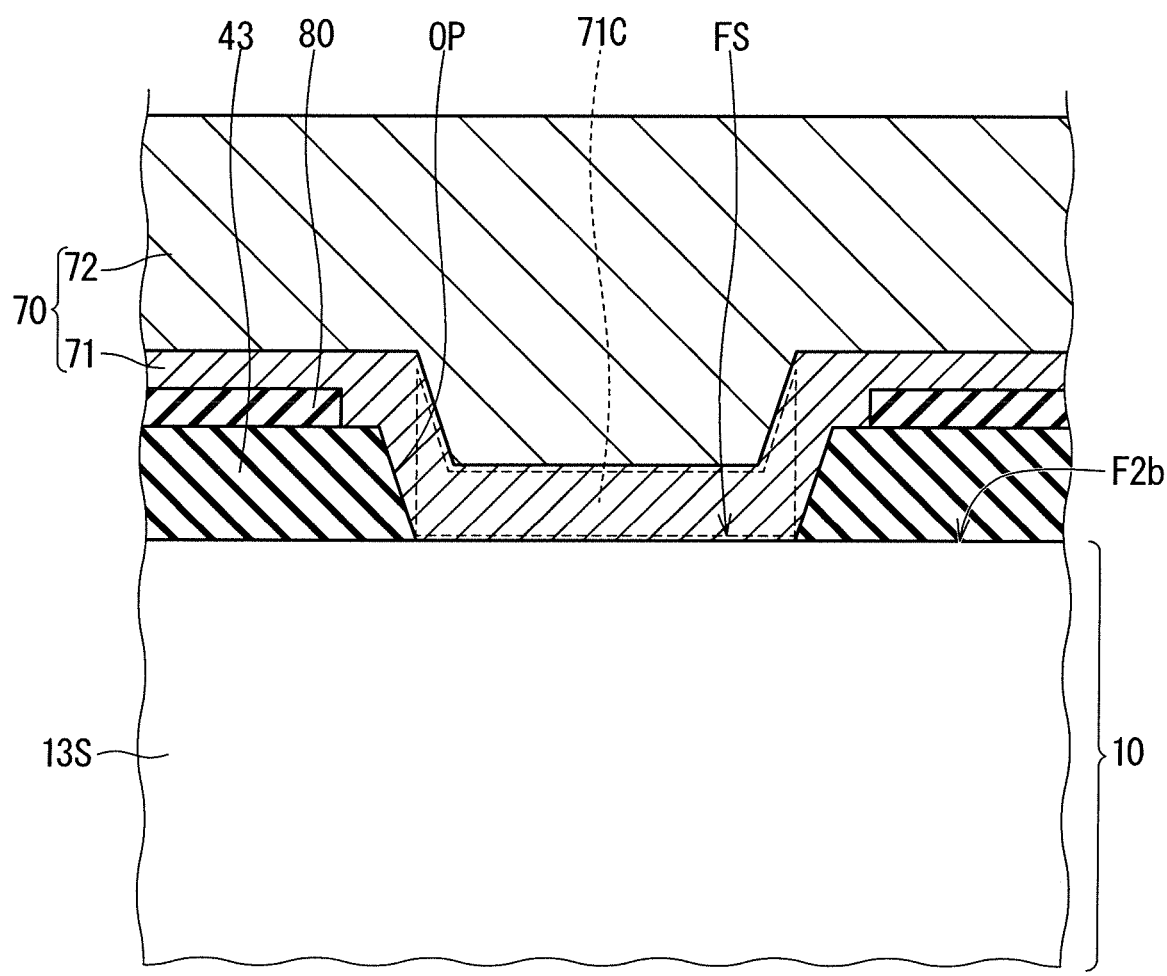
FIG. 9 is a partial cross sectional view schematically showing a configuration of a power semiconductor device in a fifth embodiment in a field of view corresponding to FIG. 3.

FIG. 9 is a partial cross sectional view schematically showing a configuration of an RC-IGBT 105 (power semiconductor device) in a fifth embodiment in a field of view corresponding to FIG. 3. The RC-IGBT 105 includes a polycrystalline silicon layer 80 in addition to the configuration of the RC-IGBT 101 (FIGS. 2 and 3: the first embodiment). The polycrystalline silicon layer 80 is away from an upper surface F2 (see FIG. 2) of a silicon substrate 10. Furthermore, the polycrystalline silicon layer 80 is in contact with a second electrode 70. More specifically, the polycrystalline silicon layer 80 is in contact with an Al—Si layer 71 included in the second electrode 70, and in the example shown in FIG. 9, the polycrystalline silicon layer 80 is disposed on an upper surface of an interlayer insulating film 43 (a surface opposite the surface facing the silicon substrate 10), and is covered with the Al—Si layer 71.

Note that in FIG. 9, only a portion of the second electrode 70 on a diode upper surface portion F2b is shown. A configuration of a portion of the second electrode 70 on an IGBT upper surface portion F2a is optional, and may be, for example, a configuration similar to the configuration shown in FIG. 9. Furthermore, on the IGBT upper surface portion F2a, the polycrystalline silicon layer may be provided or may be omitted.

Next, an example of a method for forming the polycrystalline silicon layer 80 and the second electrode 70 in the present fifth embodiment will be briefly described. First, steps up to a step of forming an Al—Si layer are performed by a method similar to the method in the fourth embodiment described above, and this layer becomes an Al—Si layer 71 in the present embodiment. Next, an Al layer 72 is formed on an upper surface F2 by sputtering. Thus, a second electrode 70 is formed. Note that since in the present fifth embodiment, the Al layer 72 is formed unlike the fourth embodiment, the thickness of the Al—Si layer 71 may be smaller than the thickness of the Al—Si layer (that is, the second electrode 70S) in the fourth embodiment.

Effects similar to the effects of the first embodiment can be obtained by the present fifth embodiment. Further, according to the present embodiment, the polycrystalline silicon layer 80 is further provided in addition to the configuration in the first embodiment. As a result, at least part of Si atoms that have diffused from the Al—Si layer 71 generate Si nodules on a surface of the polycrystalline silicon layer 80 instead of generating Si nodules on a surface of the silicon substrate 10. As a result, the generation of Si nodules on the surface of the silicon substrate 10 can be further suppressed.

Note that the embodiments can be freely combined, and the embodiments can be appropriately modified or omitted. Although the present disclosure has been described in detail, the above description is exemplified in all aspects and is not restrictive. It is understood that numerous modifications not exemplified can be assumed from the present disclosure.

EXPLANATION OF REFERENCE SIGNS

10: silicon substrate
11: first semiconductor region
12: second semiconductor region
13: third semiconductor region
14: fourth semiconductor region
20: barrier metal layer
41: gate insulating film
42: dummy insulating film
43: interlayer insulating film
51: gate electrode
52: dummy electrode
60: first electrode
70: second electrode
70S: second electrode
71: Al—Si layer
71C: contact portion
72: Al layer
80: polycrystalline silicon layer
101 to 105: RC-IGBT (power semiconductor device)
201: IGBT element
202: Schottky barrier diode element
AS: Al spike
F1: lower surface (first surface)
F2: upper surface (second surface)
OP: opening
SN: Si nodule
TR: trench

The invention claimed is:

1. A power semiconductor device comprising:
a silicon substrate having a first surface, and a second surface that is opposite the first surface and has a first portion and a second portion, the silicon substrate including
a first semiconductor region that has a first conductivity type,
a second semiconductor region that has a second conductivity type different from the first conductivity type,
a third semiconductor region that has the first conductivity type, and is separated from the first semiconductor region by the second semiconductor region, and
a fourth semiconductor region that has the second conductivity type, and is separated from the second semiconductor region by the third semiconductor region;
a gate insulating film that extends between the first semiconductor region and the third semiconductor region, and faces the second semiconductor region;
a gate electrode that faces the second semiconductor region with the gate insulating film interposed between the gate electrode and the second semiconductor region;
a first electrode that is provided on the first surface of the silicon substrate, and is in contact with the third semiconductor region and the fourth semiconductor region;
a barrier metal layer provided on the first portion of the second surface of the silicon substrate;
a second electrode provided on the second surface of the silicon substrate, and separated from the first portion of the second surface of the silicon substrate by the barrier metal layer, the second electrode including
an Al—Si layer in contact with the second portion of the second surface of the silicon substrate, and
an Al layer separated from the second portion of the second surface of the silicon substrate by the Al—Si layer; and
a polycrystalline silicon layer that is in contact with the second electrode, away from the second surface of the silicon substrate.

2. The power semiconductor device according to claim 1, wherein the second electrode has a laminated structure of the Al—Si layer and the Al layer at least on the second portion of the second surface of the silicon substrate.

3. The power semiconductor device according to claim 1, further comprising an interlayer insulating film that is disposed on the second portion of the second surface of the silicon substrate and has an opening,
wherein the Al—Si layer has a contact portion that is disposed in the opening of the interlayer insulating film in an in-plane direction and is in direct contact with the second portion of the second surface of the silicon substrate.

4. The power semiconductor device according to claim 3, wherein at least part of the Al layer is disposed directly on the interlayer insulating film.

5. The power semiconductor device according to claim 3, wherein the Al layer has a portion disposed on the contact portion of the Al—Si layer.

6. The power semiconductor device according to claim 5, wherein the Al—Si layer is disposed only inside the opening of the interlayer insulating film in a thickness direction.

7. The power semiconductor device according to claim 3, wherein a trench covered with the interlayer insulating film in a cross sectional view is provided in each of the first portion and the second portion of the second surface of the silicon substrate.

8. A power semiconductor device comprising:
- a silicon substrate having a first surface, and a second surface that is opposite the first surface and has a first portion and a second portion, the silicon substrate including
  - a first semiconductor region that has a first conductivity type,
  - a second semiconductor region that has a second conductivity type different from the first conductivity type,
  - a third semiconductor region that has the first conductivity type, and is separated from the first semiconductor region by the second semiconductor region, and
  - a fourth semiconductor region that has the second conductivity type, and is separated from the second semiconductor region by the third semiconductor region;
- a gate insulating film that extends between the first semiconductor region and the third semiconductor region, and faces the second semiconductor region;
- a gate electrode that faces the second semiconductor region with the gate insulating film interposed between the gate electrode and the second semiconductor region;
- a first electrode that is provided on the first surface of the silicon substrate, and is in contact with the third semiconductor region and the fourth semiconductor region;
- a barrier metal layer provided on the first portion of the second surface of the silicon substrate;
- a second electrode provided on the second surface of the silicon substrate, and separated from the first portion of the second surface of the silicon substrate by the barrier metal layer, the second electrode including an Al—Si layer in contact with the second portion of the second surface of the silicon substrate; and
- a polycrystalline silicon layer that is in contact with the second electrode, away from the second surface of the silicon substrate.

9. A power semiconductor device comprising:
- a silicon substrate having a first surface, and a second surface that is opposite the first surface and has a first portion and a second portion, the silicon substrate including
  - a first semiconductor region that has a first conductivity type,
  - a second semiconductor region that has a second conductivity type different from the first conductivity type,
  - a third semiconductor region that has the first conductivity type, and is separated from the first semiconductor region by the second semiconductor region, and
  - a fourth semiconductor region that has the second conductivity type, and is separated from the second semiconductor region by the third semiconductor region;
- a gate insulating film that extends between the first semiconductor region and the third semiconductor region, and faces the second semiconductor region;
- a gate electrode that faces the second semiconductor region with the gate insulating film interposed between the gate electrode and the second semiconductor region;
- a first electrode that is provided on the first surface of the silicon substrate, and is in contact with the third semiconductor region and the fourth semiconductor region;
- a barrier metal layer provided on the first portion of the second surface of the silicon substrate;
- a second electrode provided on the second surface of the silicon substrate, and separated from the first portion of the second surface of the silicon substrate by the barrier metal layer, the second electrode including
  - an Al—Si layer in contact with the second portion of the second surface of the silicon substrate, and
  - an Al layer separated from the second portion of the second surface of the silicon substrate by the Al—Si layer; and
- an interlayer insulating film that is disposed on the second portion of the second surface of the silicon substrate and has an opening,
wherein the Al—Si layer has a contact portion that is disposed in the opening of the interlayer insulating film in an in-plane direction and is in direct contact with the second portion of the second surface of the silicon substrate, and
at least part of the Al layer is disposed directly on the interlayer insulating film.

\* \* \* \* \*